United States Patent
Homma

(10) Patent No.: US 11,487,212 B2
(45) Date of Patent: Nov. 1, 2022

(54) EXPOSURE APPARATUS AND METHOD OF MANUFACTURING ARTICLE

(71) Applicant: CANON KABUSHIKI KAISHA, Tokyo (JP)

(72) Inventor: Masato Homma, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/352,648

(22) Filed: Jun. 21, 2021

(65) Prior Publication Data
US 2021/0405546 A1    Dec. 30, 2021

(30) Foreign Application Priority Data

Jun. 30, 2020 (JP) .............................. JP2020-113191

(51) Int. Cl.
*G03F 7/20*  (2006.01)
*H01L 21/027*  (2006.01)

(52) U.S. Cl.
CPC ...... *G03F 7/70891* (2013.01); *G03F 7/70933* (2013.01); *H01L 21/0274* (2013.01)

(58) Field of Classification Search
CPC .... G03F 7/70891; G03F 7/70933; G03F 7/20; G03F 7/26; G03F 7/70; G03F 7/70916; G03F 7/70866; G03F 7/70983; G03F 7/70883; G03F 7/70808; G03F 7/70316; G03F 7/70908; H01L 21/0274; H01L 21/027; G02B 27/0006; G03B 27/52
See application file for complete search history.

(56) References Cited

U.S. PATENT DOCUMENTS

| 6,731,371 B1 | 5/2004 | Shiraishi |
| 7,271,873 B2 | 9/2007 | Lallemant |
| 10,401,745 B2 | 9/2019 | Sugita |
| (Continued) | | |

FOREIGN PATENT DOCUMENTS

| JP | 2001118783 A | 4/2001 |
| JP | 2005333152 A | 12/2005 |
| JP | 2018045167 A | 3/2018 |

OTHER PUBLICATIONS

Explanation of Circumstances Concerning Accelerated Examination issued in JP Appln. No. 2020-113191 dated Jul. 5, 2021.
(Continued)

*Primary Examiner* — Mesfin T Asfaw
(74) *Attorney, Agent, or Firm* — Rossi, Kimms & McDowell LLP

(57) ABSTRACT

The present invention provides an exposure apparatus that exposes a substrate, comprising: an optical system configured to emit, in a first direction, light for exposing the substrate; a first supplier configured to supply a gas into a chamber where the optical system is arranged; and a second supplier configured to supply a gas to an optical path space where the light from the optical system passes through, wherein the second supplier includes a gas blower including a blowing port from which a gas is blown out in a second direction, and the guide member configured to guide the gas blown out from the blowing port to the optical path space, and the guide member includes a plate member extended on a side of the first direction of the blowing port so as to be arranged along the second direction.

28 Claims, 10 Drawing Sheets

(56) References Cited

U.S. PATENT DOCUMENTS

2002/0191163 A1    12/2002  Hasegawa
2006/0209274 A1*   9/2006  To ..................... G03F 7/70908
                                                                 355/30
2011/0228239 A1     9/2011  Gosen

OTHER PUBLICATIONS

Extended European Search Report issued in European Appln. No. 21180759.9 dated Dec. 3, 2021.

* cited by examiner

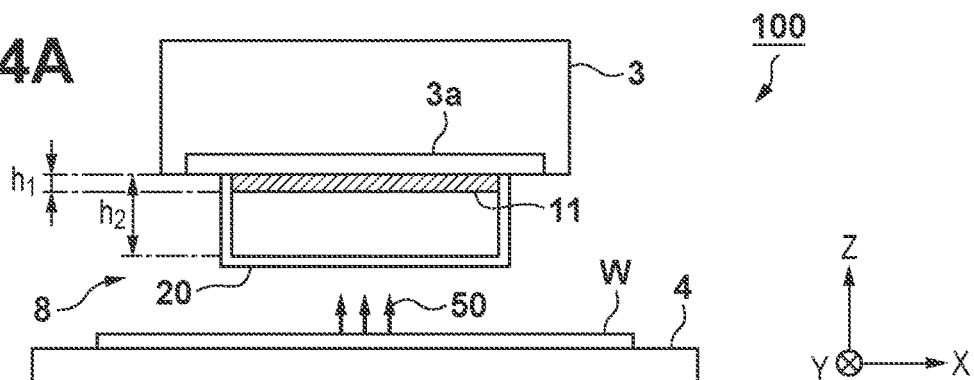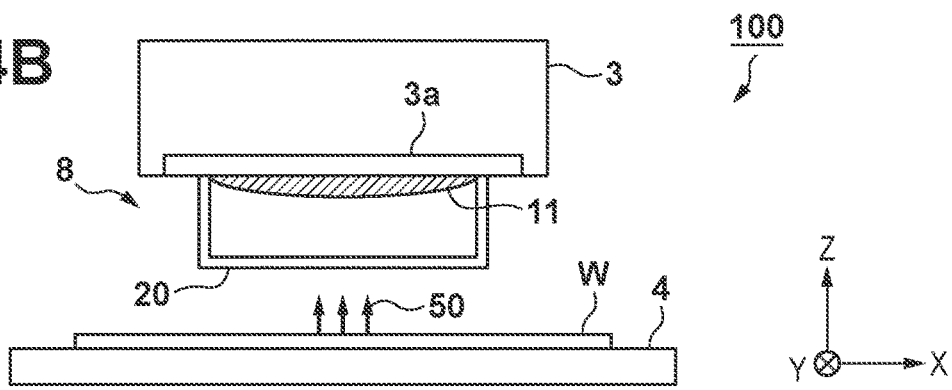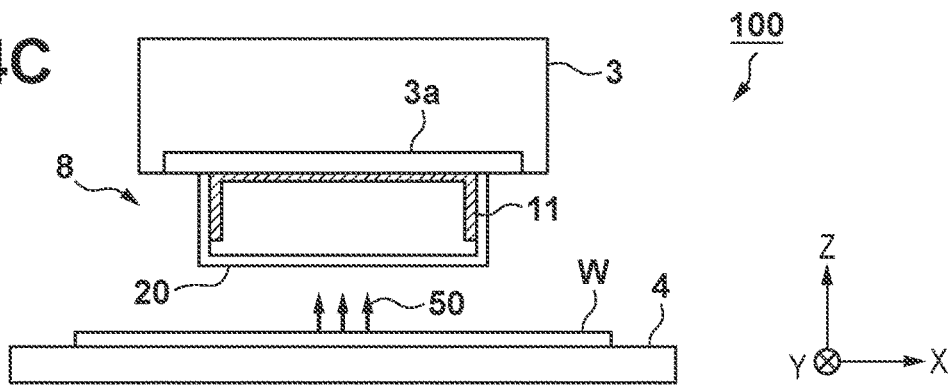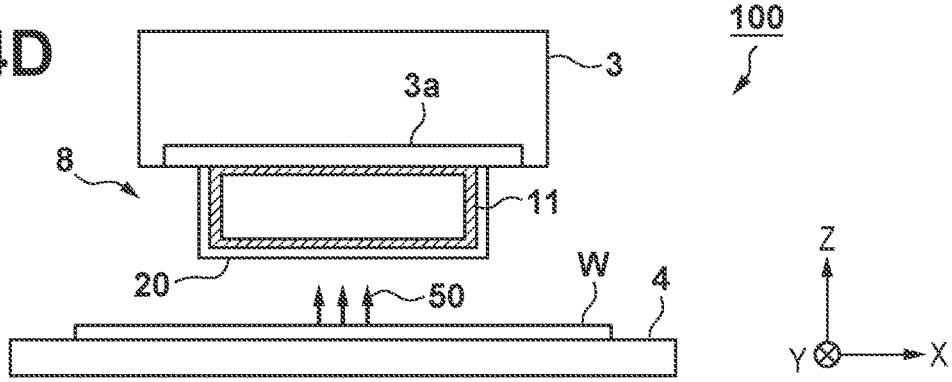

EXPOSURE APPARATUS AND METHOD OF MANUFACTURING ARTICLE

BACKGROUND OF THE INVENTION

Field of the Invention

The present invention relates to an exposure apparatus and a method of manufacturing an article.

Description of the Related Art

As one of apparatuses used in the manufacturing process (lithography process) of a liquid crystal panel, a semiconductor device, or the like, there is an exposure apparatus that projects a pattern image of an original onto a substrate by a projection optical system and exposes the substrate. In the exposure apparatus, it is known that when a resist (photosensitive material) applied on a substrate is exposed, a gas (outgas) is generated from the resist. If the outgas reacts with an impurity such as an acid, a base, or an organic substance in the surrounding atmosphere or in the surface film of an optical element, this causes fogging of an optical element arranged around the substrate. Particularly, an optical element located in the lowermost end of the projection optical system is arranged facing the substrate, so that it is likely to fog due to the outgas from the resist. If the optical element fogs, the light transmittance of the optical element decreases, and this can lead to an insufficient exposure amount, an uneven illuminance, or a flare. Japanese Patent Laid-Open No. 2005-333152 proposes an arrangement in which a gas blown downward from a nozzle provided in the side portion of a projection optical system is guided along the curved surface of a guide element by the Coanda effect to supply the gas between the projection optical system and a substrate.

In the arrangement described in Japanese Patent Laid-Open No. 2005-333152, the flow direction of the gas is changed by the Coanda effect by a guide member, and such a gas has a property of entraining a surrounding gas. Hence, the gas can flow between the optical element of the projection optical system and the substrate while entraining an outgas generated from a resist. Therefore, the outgas reaching the optical element of the projection optical system (that is, fogging of the optical element) cannot be sufficiently avoided.

SUMMARY OF THE INVENTION

The present invention provides an exposure apparatus advantageous in, for example, reducing fogging of an optical element in an optical system.

According to one aspect of the present invention, there is provided an exposure apparatus that exposes a substrate, comprising: an optical system configured to emit, in a first direction, light for exposing the substrate; a first supplier configured to supply a gas into a chamber where the optical system is arranged; and a second supplier configured to supply a gas to an optical path space where the light from the optical system passes through, wherein the second supplier includes a gas blower and a guide member, the gas blower including a blowing port from which a gas is blown out in a second direction at a flow velocity higher than a flow velocity of a gas blown out from the first supplier, and the guide member being configured to guide the gas blown out from the blowing port to the optical path space, and the guide member includes a plate member extended on a side of the first direction of the blowing port so as to be arranged along the second direction in which the gas is blown out from the blowing port.

Further features of the present invention will become apparent from the following description of exemplary embodiments with reference to the attached drawings.

BRIEF DESCRIPTION OF THE DRAWINGS

FIGS. 4A to 4D are views each showing an arrangement example and a shape example of a blowing port inside a guide member;

DESCRIPTION OF THE EMBODIMENTS

Figure 1:
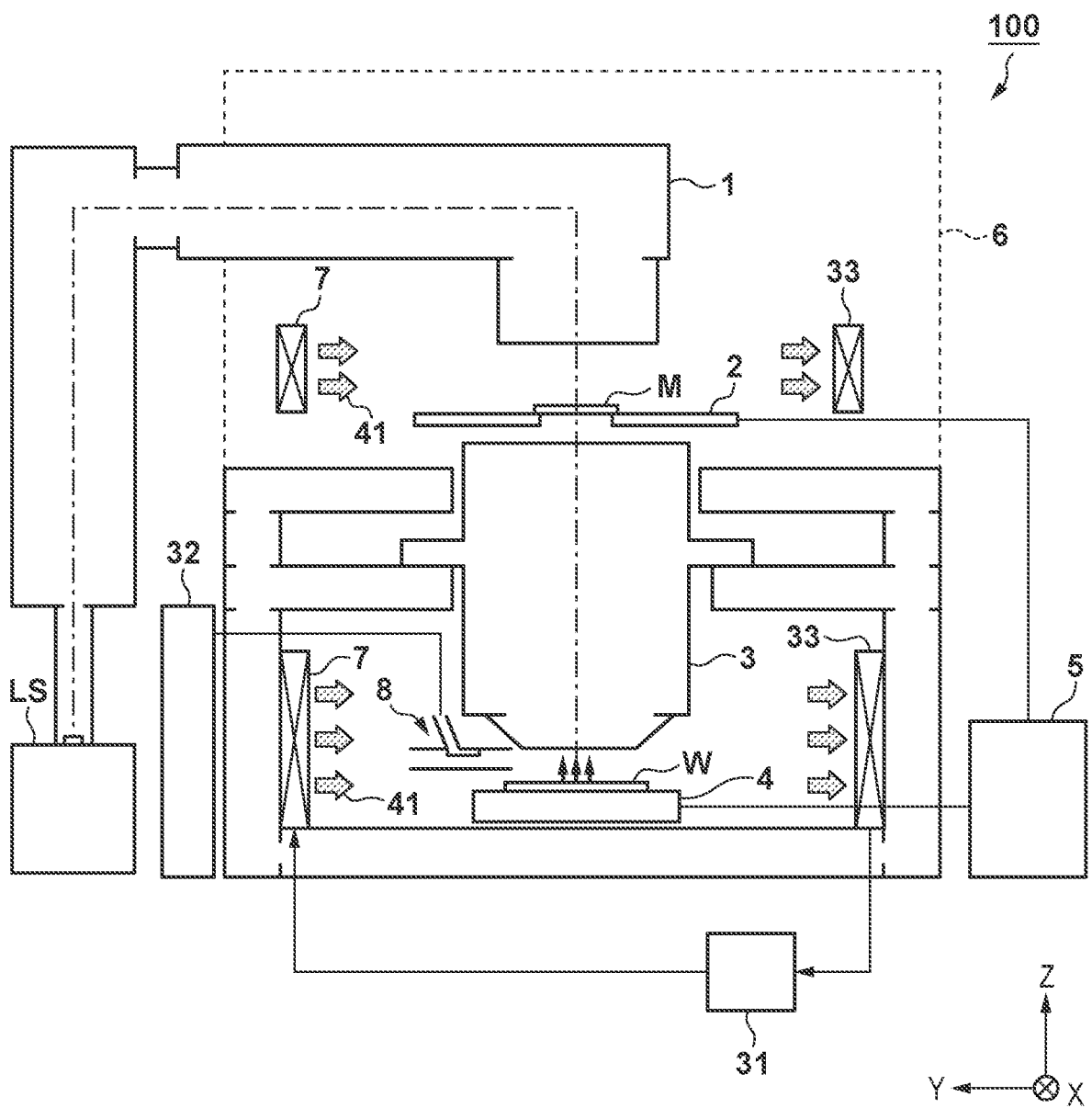
FIG. 1 is a view showing the overall arrangement of an exposure apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The first embodiment according to the present invention will be described. FIG. 1 is a view showing the overall arrangement of an exposure apparatus 100 according to this embodiment. The exposure apparatus 100 according to this embodiment is a step-and-scan exposure apparatus that exposes a substrate W while scanning an original M and the substrate W, thereby transferring the pattern of the original M onto the substrate. The exposure apparatus 100 is also called a scanning exposure apparatus or a scanner. In this embodiment, the original M is, for example, a mask (reticle) made of quartz, on which a circuit pattern to be transferred onto each of a plurality of shot regions on the substrate W has been formed. The substrate W is a wafer coated with a photoresist and, for example, a single crystal silicon substrate or the like can be used. Note that in this embodiment, a step-and-scan exposure apparatus is exemplarily described, but the present invention is also applicable to a step-and-repeat exposure apparatus.

The exposure apparatus 100 can include an illumination optical system 1, an original stage 2 that can move while holding the original M, a projection optical system 3, a substrate stage 4 that can move while holding the substrate W, and a controller 5. The controller 5 is formed by, for example, a computer that includes a CPU and a memory, and is electrically connected to respective units in the apparatus, thereby comprehensively controlling the overall operation of the apparatus. In the following description, a direction parallel to the optical axis of light emitted from the projection optical system 3 and strikes the substrate W is assumed to be the Z-axis direction, and two directions orthogonal to each other in a plane perpendicular to the optical axis are assumed to be the X-axis direction and the Y-axis direction, respectively. Note that in the following description, the "X-axis direction" can be defined to include the +X direction and the −X direction. This also applies to the "Y-axis direction" and the "Z-axis direction".

The illumination optical system 1 shapes light emitted from a light source LS such as a mercury lamp, an ArF excimer laser, or a KrF excimer laser into, for example, band-like or arcuate slit-shaped light, and illuminates a portion of the original M with this slit-shaped light. The light transmitted through the portion of the original M enters the projection optical system 3 as a pattern light reflecting the pattern of the portion of the original M. The projection optical system 3 has a predetermined projection magnification, and projects the pattern image of the original M onto the substrate (more specifically, the resist on the substrate) by using the pattern light. The original M and substrate W are respectively held by the original stage 2 and substrate stage 4, and are arranged in optically conjugate positions (the object plane and image plane of the projection optical system 3) via the projection optical system 3. The controller 5 relatively scans, in a predetermined scanning direction (for example, the X direction), the original stage 2 and substrate stage 4 in synchronism with each other at a velocity ratio matching the projection magnification of the projection optical system 3. With this arrangement, the pattern of the original M can be transferred onto the substrate. Here, in this embodiment, each of the illumination optical system 1 and the projection optical system 3 is configured to emit light downward (−Z direction or first direction). Therefore, in the description below, "lower" is used to mean the side of the direction (−Z direction side or the first direction side) in which light is emitted from the illumination optical system 1 and the projection optical system 3.

The exposure apparatus 100 also includes a first supplier 7 that supplies, to the inside of a chamber 6 (into the chamber) in which the projection optical system 3 is arranged, a gas 41 (for example, clean air) from a first gas supply source 31. For example, the first supplier 7 can be configured as a circulatory gas supply mechanism that generates a predetermined airflow inside the chamber 6. In this case, the first gas supply source 31 includes, for example, a fan, a filter, and the like, and is configured to send the gas drawn from the inside of the chamber by a drawer 33 to the first supplier 7. Then, the first supplier 7 can generate the predetermined airflow inside the chamber 6 by blowing out the gas 41 sent (supplied) from the first gas supply source 31 into the chamber. Here, a gas blowing port in the first supplier 7 may be provided in, for example, the inner surface (for example, the wall portion) of the chamber 6, or may be provided (arranged) inside the chamber 6. The first gas supply source 31 may be a component of the exposure apparatus 100, but may not be a component of the exposure apparatus 100 when it is applied to an equipment or the like of a factory where the exposure apparatus 100 is installed. Note that in the arrangement example of the exposure apparatus 100 shown in FIG. 1, the illumination optical system 1 is also provided with the first supplier 7.

In the exposure apparatus 100, it is known that when a resist (photosensitive material) applied onto a substrate is exposed, a gas (outgas 50) is generated from the resist. If this outgas 50 reacts with an impurity such as an acid, a base, or an organic substance in the surrounding atmosphere or in the surface film of an optical element, this causes fogging of an optical element arranged around the substrate W. Particularly, an optical element (for example, a lens, a glass plate, or a mirror) located in the lowermost end of the projection optical system 3 is arranged facing the substrate W, so that it is likely to cause fogging due to the outgas 50 from the resist. If the optical element fogs, the light transmittance of the optical element decreases, and this can lead to an insufficient exposure amount, an uneven illuminance, or a flare. Therefore, the exposure apparatus 100 according to this embodiment includes a second supplier 8 that supplies a gas 42 to an optical path space S where light (pattern light) from the projection optical system 3 passes through. The specific arrangement of the second supplier 8 will be described below.

[Arrangement of Second Supplier]

Figure 2A:
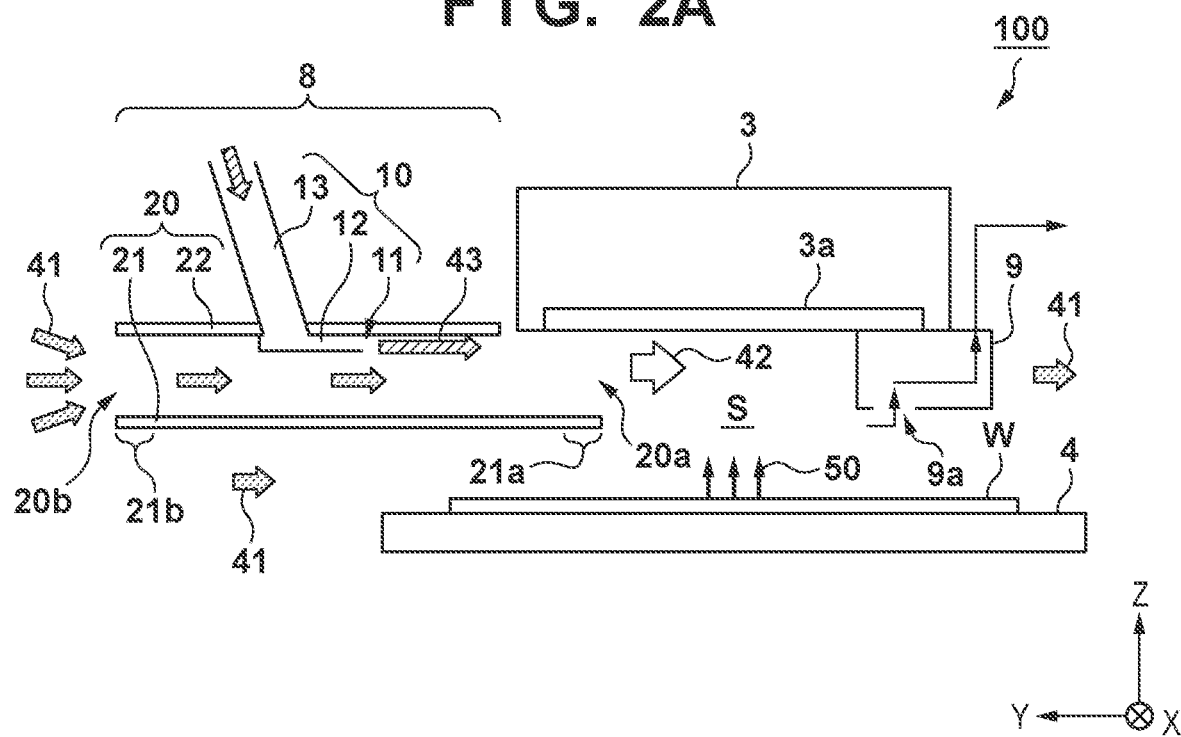
FIGS. 2A and 2B are views each showing an arrangement example of a second supplier according to the first embodiment.
Figure 2B:
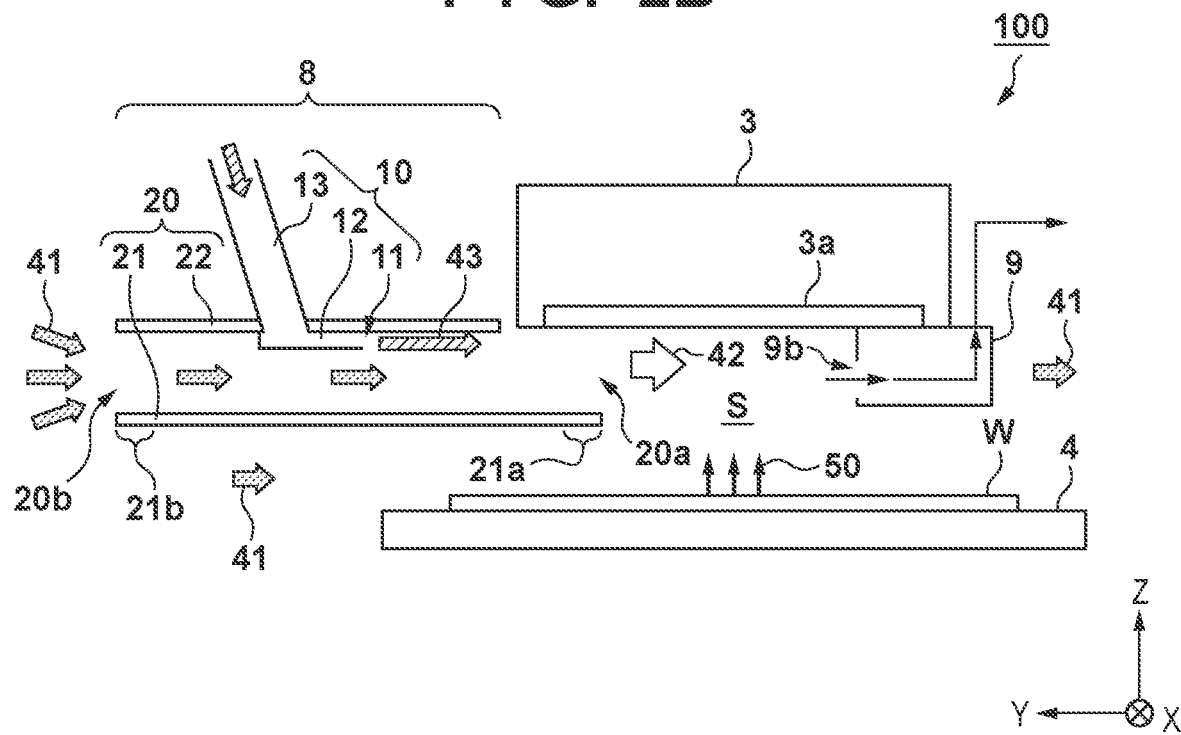

FIGS. 2A and 2B are views each showing an arrangement example of the second supplier 8 according to this embodiment. In addition to the second supplier 8, each of FIGS. 2A and 2B shows a part of the projection optical system 3 around the second supplier 8, the substrate W, and the substrate stage 4. The examples shown in FIGS. 2A and 2B are different in the arrangement of a gas exhauster 9, but similar in the remaining arrangement (the arrangement of the second supplier 8 or the like). The gas exhauster 9 is a mechanism that exhausts a gas having passed through the optical path space S to the outside. As shown in each of FIGS. 2A and 2B, in the lower portion (−Z direction side or the first direction side) of the projection optical system 3, the gas exhauster 9 can be arranged on the opposite side of the second supplier 8 with respect to the optical path space S. The gas exhauster 9 may be configured to draw the gas from an opening 9a provided on the substrate W side and exhaust it as shown in FIG. 2A, or may be configured to draw the gas from an opening 9b provided on the second supplier 8 side and exhaust it as shown in FIG. 2B.

The second supplier 8 includes a gas blower 10 and a guide member 20 (rectifier), and is configured (arranged) so as to supply the gas 42 to the optical path space S where light (pattern light) from the projection optical system 3 passes through. Here, for example, the optical path space S may be defined as a space between an optical element 3a, which is located in the lowermost end of the projection optical system 3 and faces the substrate W, and the substrate W held by the substrate stage 4. The optical element 3a may be, for example, a light transmitting element such as a lens or a glass plate that transmits light, or may be a light reflecting element such as a mirror that reflects light.

The gas blower 10 includes a blowing port 11 from which a gas 43 (for example, clean air or nitrogen gas) is blown out at a flow velocity higher than the flow velocity of the gas 41 blown out from the first supplier 7. The gas blower 10 is formed as a tube that defines the gas flow path, and the upstream side (an end portion on the opposite side of the blowing port 11) thereof is connected to a utility. For example, as shown in FIG. 1, the gas blower 10 is connected to a second gas supply source 32 different from the first gas supply source 31 which is used to send the gas 41 to the first gas supplier 7, and configured to blow out, from the blowing port 11, the gas sent (supplied) from the second gas supply source 32. Here, the second gas supply source 32 may be a component of the exposure apparatus 100, but may not be a component of the exposure apparatus 100 when it is applied to an equipment or the like of a factory where the exposure apparatus 100 is installed. When the second gas supply source 32 is arranged as a component of the exposure apparatus 100, the second gas supply source 32 includes, for example, a fan, a compressor, an evaporator, a high-pressure cylinder, and the like, and a pressure regulator can be provided.

The guide member 20 is a member that guides (rectifies), to the optical path space S, the gas 43 blown out from the blowing port 11. The guide member 20 includes a first plate member 21 (lower plate member) extended below (the −Z direction side or the first direction side) of the blowing port 11 so as to be arranged along the blowing direction (−Y direction or second direction) of the gas 43 from the blowing port 11 of the gas blower 10. The first plate member 21 includes a first end portion 21a which is closer to the optical path space S than the blowing port 11 of the gas blower 10, and a second end portion 21b which is farther from the optical path space S than the blowing port 11. That is, the blowing port 11 of the gas blower 10 is arranged between the first end portion 21a and the second end portion 21b of the first plate member 21 in the blowing direction of the gas 43. Here, the first end portion 21a of the first plate member 21 is arranged below the projection optical system 3, and preferably arranged below a part of the optical element 3a of the projection optical system 3. On the other hand, the second end portion 21b of the first plate member 21 is arranged at a position possibly spaced apart from the optical path space S, and preferably arranged outside the movable range of the substrate W (substrate stage 4). As an example, the second end portion 21b of the first plate member 21 can be arranged between the blowing port 11 of the gas blower 10 and the gas blowing port of the first supplier 7. With this arrangement, it is possible to reduce entrainment of the outgas 50 generated from the substrate W into the gas 43 blown out from the blowing port 11, so that a cleaner gas can be supplied to the optical path space S.

In this embodiment, in addition to the first plate member 21, the guide member 20 is configured to further include a second plate member 22 (upper plate member) extended above the blowing port 11 so as to face the first plate member 21. That is, the second plate member 22 is extended on the opposite side of the first plate member 21 (+Z direction side of the blowing port 11) with respect to the blowing port 11 so as to face the first plate member 21. The guide member 20 is formed in a tubular shape in which parts (lower surface and upper surface) of the inner surface are defined by the first plate member 21 and the second plate member 22, respectively. In this case, in the tubular guide member 20, a first opening 20a whose one side is defined by the first end portion 21a of the first plate member 21, and a second opening 20b whose one side is defined by the second end portion 21b of the first plate member 21 on the opposite side of the first opening 20a can be formed.

The gas blower 10 is formed such that the blowing port 11 is arranged between the first opening 20a and the second opening 20b inside the tubular guide member 20 and the area of the blowing port 11 is smaller than the sectional area (X-Z sectional area) of the guide member 20. As an example, the gas blower 10 can include a first tube portion 12 including the blowing port 11 as one end and arranged inside the guide member 20, and a second tube portion 13 extending through the guide member 20 (second plate member 22) and communicating with the other end (the end portion on the opposite side of the blowing port 11) of the first tube portion 12. The second tube portion 13 can be connected to the second gas supply source 32.

Figure 3:
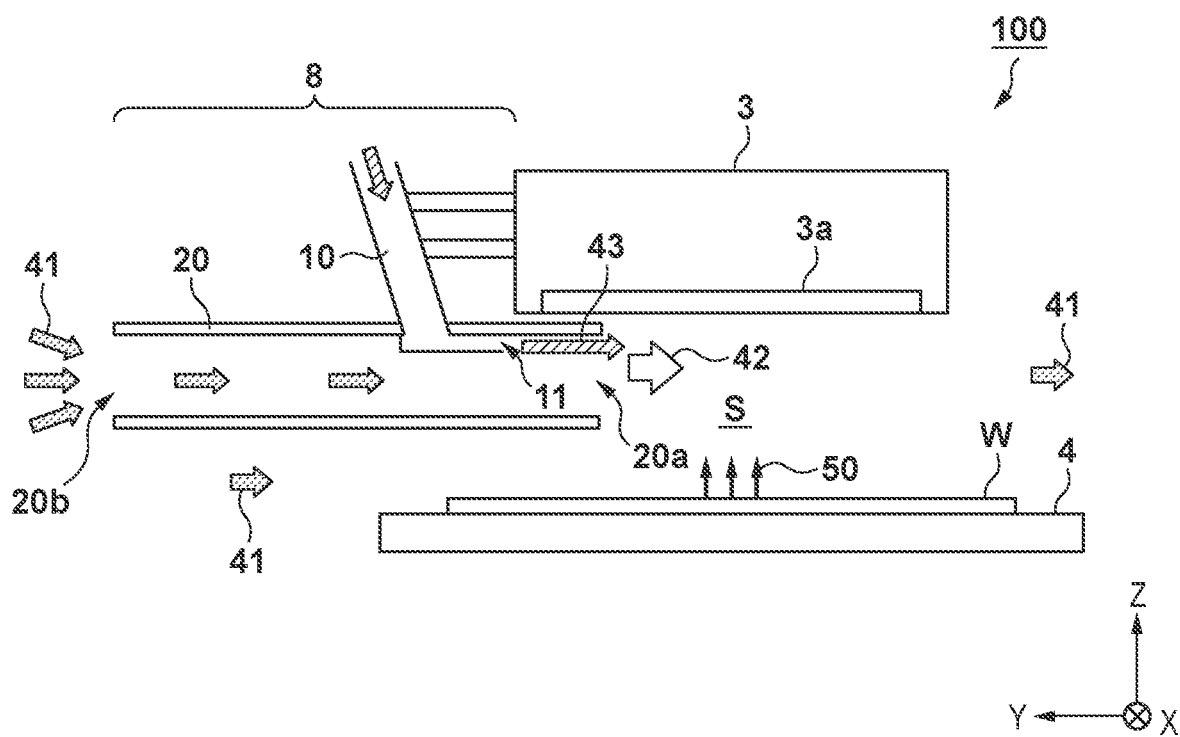
FIG. 3 is a view showing an arrangement example in which the second supplier according to the first embodiment is attached to a projection optical system.

As shown in FIG. 3, the gas blower 10 (first tube portion 12 and second tube portion 13) may be attached to the projection optical system 3. FIG. 3 is a view showing an arrangement example in which the second supplier 8 (gas blower 10) according to this embodiment is attached to the projection optical system 3. This arrangement can be advantageous in spatial restriction inside the exposure apparatus 100 and reducing fluctuations in the positional relationship between the gas blower 10 and the optical element 3a. Note that the gas exhauster 9 as shown in each of FIGS. 2A and 2B may also be provided in the arrangement shown in FIG. 3.

The second supplier 8 arranged as described above blows out, in a direction (−Y direction) toward the first opening 20a of the guide member 20, the gas 43 from the blowing port 11 of the gas blower 10 at a flow velocity higher than the flow velocity of a gas blown out from the first supplier 7. With this arrangement, the gas 41 is drawn from the second opening 20b of the guide member 20, and the gas 41 drawn from the second opening 20b can be blown out from the first opening 20a of the guide member 20 to the optical path space S together with the gas 43 from the blowing port 11. That is, it is possible to supply the gas 42 of a flow amount larger than the flow amount of the gas 43 blown out from the blowing port 11 by the amount of the gas 41 drawn from the second opening 20b of the guide member 20.

This principle will be described in detail. When the gas 43 is blown out from the blowing port 11 of the gas blower 10 at a flow velocity higher than the flow velocity of the gas 41 blown out from the first supplier 7, the gas 41 is drawn around the blowing port 11 inside the guide member 20 and, as a result, a low pressure (negative pressure) is generated around the blowing port 11. Thus, the gas 41 is drawn (sucked) into the guide member 20 in accordance with a blowout of the gas 43 from the blowing port 11. Here, since the blowing port 11 is surrounded by the guide member 20, the intake port of the gas 41 is limited to the first opening 20a or the second opening 20b. However, since the gas 43 blown out from the blowing port 11 flows in the −Y direction, the gas flow inside the guide member 20 is formed in a direction from the second opening 20b to the first opening 20a. Accordingly, the gas 41 is drawn (sucked) from the second opening 20b. On the other hand, almost no gas is drawn from the first opening 20a due to the blowing direction of the gas 43 from the blowing port 11. Therefore, it is possible to blow out, from the first opening 20a of the guide member 20 to the optical path space S, the gas 42 of a flow amount equal to or larger than the flow amount of the gas 43 supplied to the blowing port 11 of the gas blower 10.

Here, it is unnecessary that the arrangement direction from the second opening 20b to the first opening 20a in the guide member 20 matches the direction of the gas 41 blown out from the gas blowing port of the first supplier 7. As has been described above, the drawn direction of the gas 41 is determined by the blowing direction of the gas 43 from the blowing port 11 and the direction of the guide member 20. However, in terms of drawing the cleaner gas 41 including no outgas 50, the blowing direction of the gas 41 from the first supplier 7 preferably matches the arrangement direction from the second opening 20b to the first opening 20a. Further, in terms of including no outgas 50, the second opening 20b need only be located at a position away from the optical path space S, but the second opening 20b is preferably arranged near the gas blowing port of the first supplier 7. With this arrangement, it is possible to draw, from the second opening 20b, the clean gas 41 blown out from the gas blowing port of the first supplier 7 and supply it from the first opening 20a to the optical path space S.

Next, the position and shape of the blowing port 11 (first tube portion 12) of the gas blower 10 will be described. In the second supplier 8 shown in each of FIGS. 2A and 2B, the blowing port 11 of the gas blower 10 is arranged to be spaced apart from the first plate member 21 and provided in the second plate member 22 inside the guide member 20, but the present invention is not limited to this. The blowing port 11 of the gas blower 10 may be arranged at an arbitrary position inside the guide member 20 and have an arbitrary shape as long as the area of the blowing port 11 is smaller than the sectional area (X-Z sectional area) of the guide member 20. For example, the blowing port 11 of the gas blower 10 may be provided in the first plate member 21, or may be arranged to be spaced apart from both the first plate member 21 and the second plate member 22 (for example, may be arranged in the central portion of the guide member 20).

Each of FIGS. 4A to 4D is a view of the second supplier 8 when viewed from the −Y direction side, and shows an arrangement example and a shape example of the blowing port 11 of the gas blower 10 inside the guide member 20. The position and shape of the blowing port 11 can be determined, for example, in accordance with the flow velocity distribution of the gas 42 to be supplied to the optical path space S. For example, the blowing port 11 may have a rectangular shape (straight shape) as shown in FIG. 4A, or may have a curved shape (arcuate shape) as shown in FIG. 4B. Each of these arrangements is effective in a case in which the −Y direction flow velocity of the gas supplied from the second supplier 8 to the optical path space S is changed in accordance with the optical axis direction (Z-axis direction) of light from the projection optical system 3. In each of the arrangement examples shown in FIGS. 4A and 4B, the blowing port 11 is provided in the upper surface (second plate member 22) of the guide member 20. Hence, the flow velocity of the gas in the optical path space S can be increased as the gas is closer to the optical element 3a of the projection optical system 3 (that is, decreased as the gas is closer to the substrate W). On the other hand, in order to decrease (uniformize) a difference in −Y direction flow velocity of the gas in the optical axis direction in the optical path space S, the blowing port 11 can be arranged/formed as shown in each of FIGS. 4C and 4D. In each of the arrangement examples shown in FIGS. 4C and 4D, the blowing port 11 is provided not only in the upper surface (second plate member 22) of the guide member 20 but also in the side surface (X-axis direction side) or the lower surface (first plate member 21) of the guide member 20.

Here, the arrangement of the second supplier 8 that enables efficiently drawing of the gas 41 from the second opening 20b of the guide member 20 will be described. In the arrangement of the second supplier 8 according to this embodiment as described above, the area of the blowing port 11 is made smaller than the sectional area of the guide member 20 so as to increase the blowing flow velocity of the gas 43 from the blowing port 11. The smaller the area of the blowing port 11, the more the gas can be efficiently drawn from the second opening 20b of the guide member 20 in accordance with a blowout of the gas 43 from the blowing port 11. The reason for this is that the smaller the area of the blowing port 11, the lower the pressure around the blowing port 11 can be made inside the guide member 20. As an example, when the blowing port 11 is formed in the rectangular shape as shown in FIG. 4A, the smaller an opening height h1 of the blowing port 11 than a sectional height h2 of the guide member 20, the more efficiently the gas 41 can be drawn from the second opening 20b of the guide member 20. The opening height h1 of the blowing port 11 is preferably equal to or smaller than a half (more preferably, equal to or smaller than ⅓ or ¼) of the sectional height h2 of the guide member 20. In terms of the area, the sectional area of the blowing port 11 is preferably equal to or smaller than ¼ (more preferably, equal to or smaller than ⅑ or 1/16) of the sectional area of the guide member 20.

Figure 5:
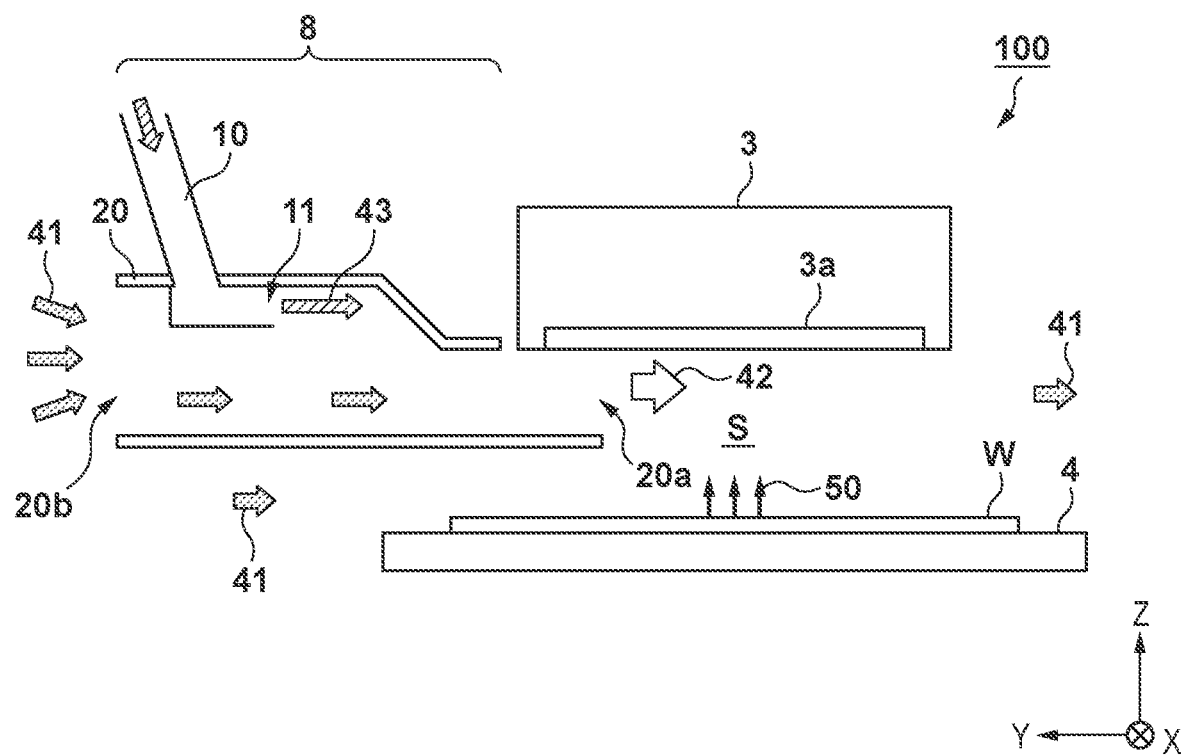
FIG. 5 is a view showing a modification of the second supplier according to the first embodiment.
Figure 6A:
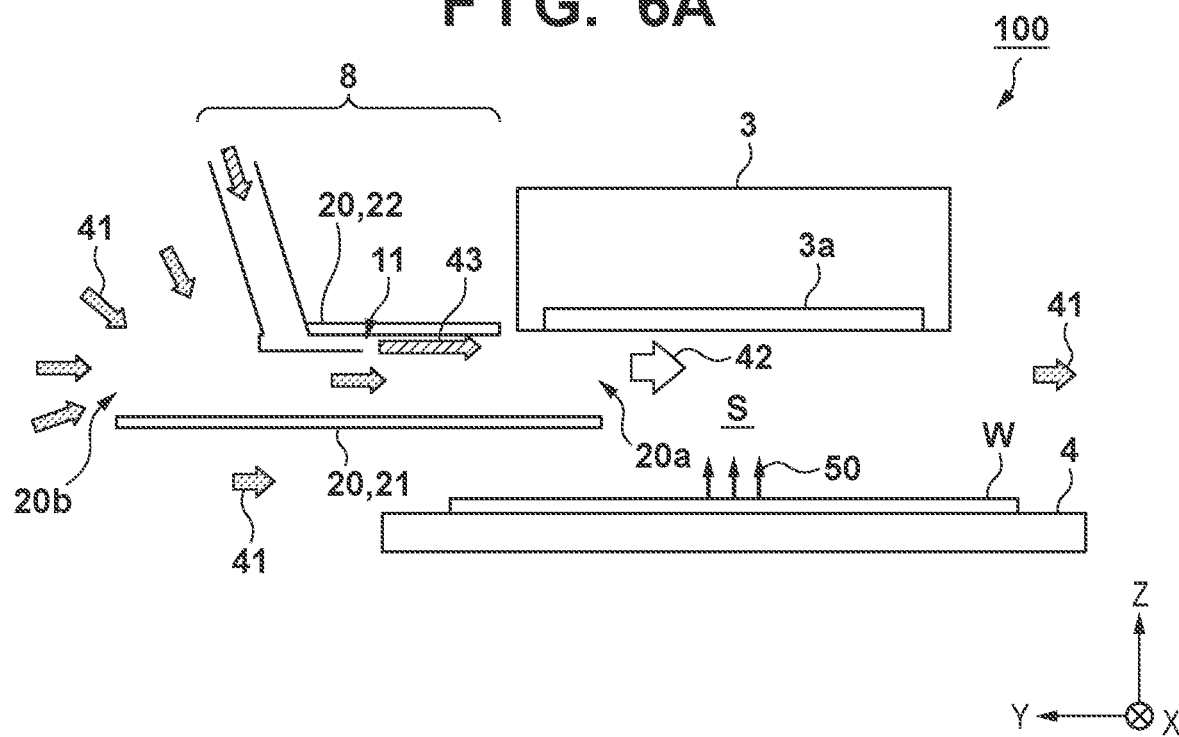
FIGS. 6A and 6B are views each showing another modification of the second supplier according to the first embodiment.
Figure 6B:
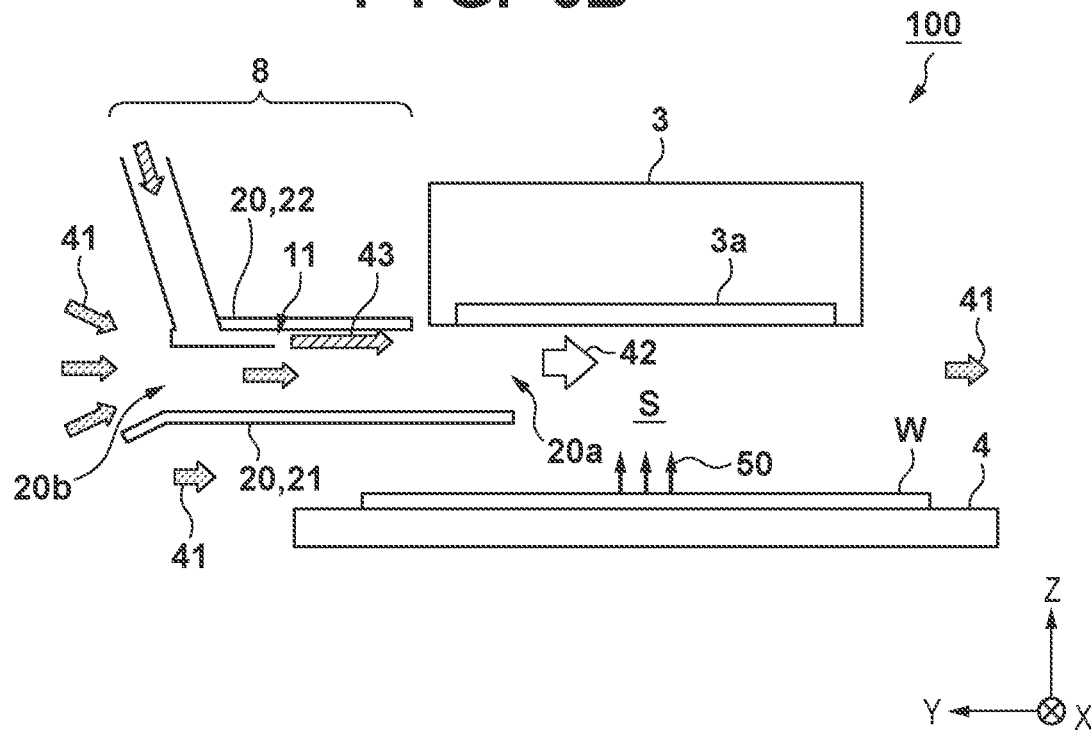

As an example, assume a case in which the blowing port 11 of the gas blower 10 is formed in the rectangular shape as shown in FIG. 4A and the sectional height h2 of the guide member 20 is 5 mm. In this case, when the ratio of the opening height h1 of the blowing port 11 to the sectional height h2 of the guide member 20 is about 1:7, it is possible to blow out, from the first opening 20a of the guide member 20, the gas 42 of a flow amount 2.5 times larger than the flow amount of the gas 43 blown out from the blowing port 11. Note that the dimensions (for example, height) of each of the guide member 20 and the blowing port 11 can be arbitrarily set. For example, the dimensions of the first opening 20a and the second opening 20b of the guide member 20 can be arbitrarily set in accordance with the distance (several mm to several ten mm) between the optical element 3a of the projection optical system 3 and the substrate W. For example, in order to efficiently draw the gas 41 from the second opening 20b into the guide member 20, as shown in FIG. 5, the guide member 20 may be formed such that the opening area of the second opening 20b is larger than the opening area of the first opening 20a. In this case, the opening height of the second opening 20b may be larger than the distance between the optical element 3a and the substrate W. As another arrangement for efficiently drawing the gas 41, as shown in FIG. 6A, the guide member 20 may be formed such that the first plate member 21 and the second plate member 22 of the guide member 20 are made to have different lengths so as to form the large second opening 20b. Alternatively, as shown in FIG. 6B, the second opening 20b may have a reverse taper shape (that is, a shape in which the sectional area increases toward the second opening 20b) to efficiently draw the gas 41.

Figure 7A:
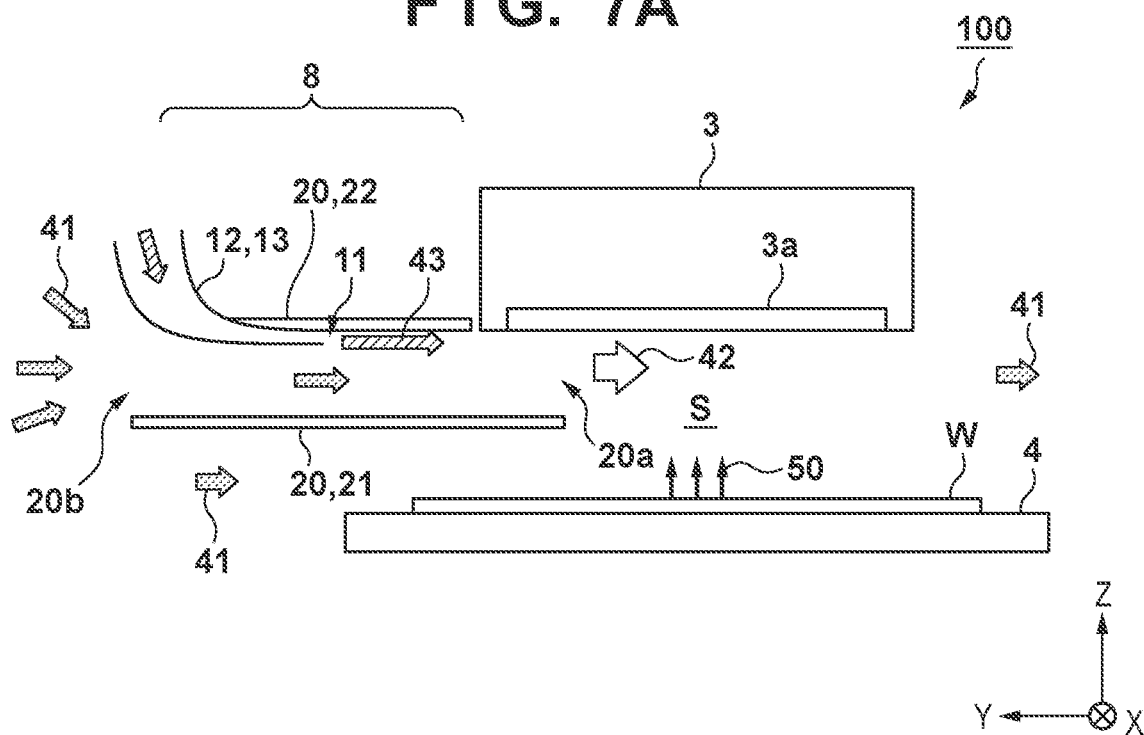
FIGS. 7A and 7B are views each showing still another modification of the second supplier according to the first embodiment.
Figure 7B:
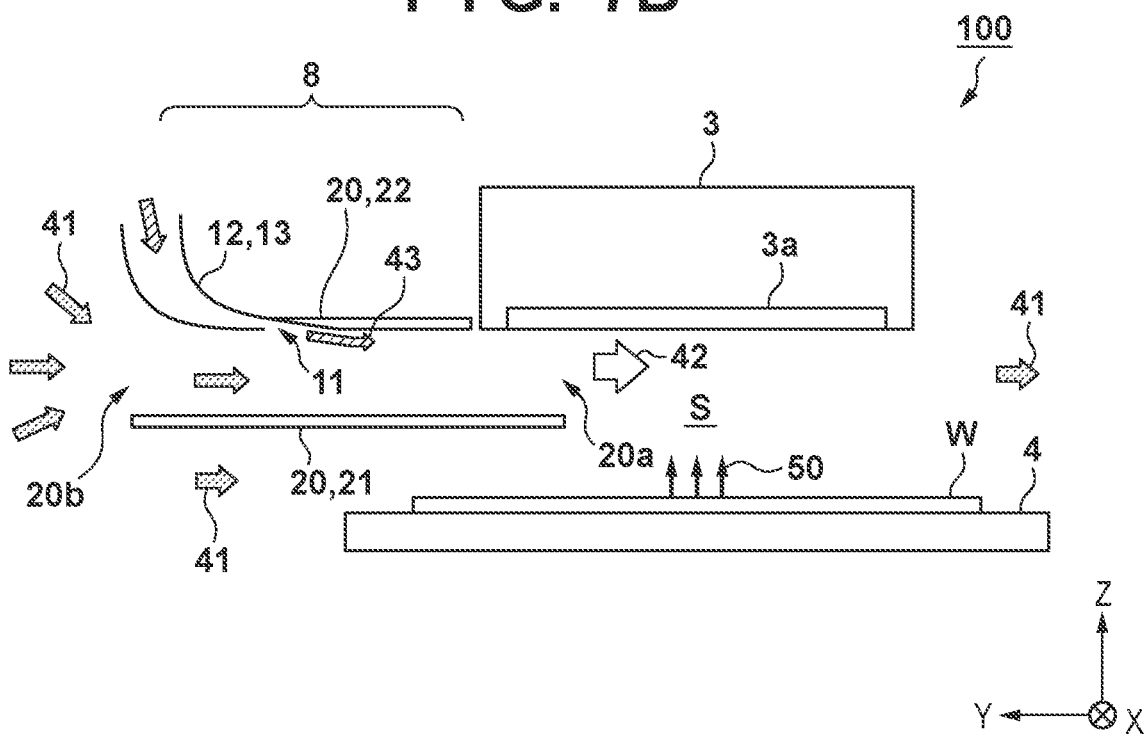

Alternatively, as a method of increasing the flow velocity of the gas 43 from the blowing port 11, as shown in each of FIGS. 7A and 7B, the shape of the blowing port 11 or the shape of the tube portion (first tube portion 12 and second tube portion 13) of the gas blower 10 may be changed. For example, as shown in each of FIGS. 7A and 7B, each of the first tube portion 12 and the second tube portion 13 can be formed in a curved shape, or may be tapered toward the blowing port 11. Further, as shown in FIG. 7B, when the exit portion of the blowing port 11 in the gas blower 10 is formed to have a curved surface shape so as to allow the gas 43 to flow along the second plate member 22, the flow velocity of the gas 43 from the blowing port 11 can be increased.

The distance (Y-axis direction) between the blowing port 11 of the gas blower 10 and the first opening 20a of the guide member 20 is preferably larger than, for example, the value of the opening height h2 of the first opening 20a. That is, the blowing port 11 is preferably arranged on the inner side (+Y direction side) of the guide member 20 from the first opening 20a by the distance larger than the value of the opening height h2 of the first opening 20a. With this arrangement, the gas flowing from the first opening 20a into the guide member 20 (that is, a counterflow of the gas) can be reduced. The closer the position (Y-axis direction) of the blowing port 11 is to the first opening 20a of the guide member 20, the more the flow velocity distribution is uniformized before the first opening 20a. However, in the optical path space S, the flow velocity on the optical element 3a side is high, and the flow velocity on the substrate W side is lower than the flow velocity on the optical element 3a side. In this case, the strength of blowing off the outgas 50 changes in the Z direction. Hence, it is possible to blow off the most outgas 50 on the substrate W side, and the outgas 50 having passed the substrate W side can be blown off on the optical element 3a side at a high velocity. On the other hand, the farther the position (Y-axis direction) of the blowing port 11 is from the first opening 20a of the guide member 20, the more the flow velocity distribution of the gas 42 blown out from the first opening 20a can be uniformized in the optical axis direction. In this case, the effect of blowing off the outgas 50 of a certain amount can be obtained in any region in the Z direction. In either case, the outgas reaching the optical element 3a can be reduced. In order to prevent the gas 42 from entraining the surrounding gas (more reliably maintain the two types of flow velocity distributions described above), it is more preferable that the positional relationship between the second plate member 22 and the optical element 3a in the flow paths of the gas 43 and the gas 42 is expressed by a flat structure as much as possible. The flat structure is a structure in which the second plate member 22 and the optical element 3a are connected in a continuous plane. If the flat structure cannot be made, a structure with a recess is more preferable than a structure with a protrusion.

[Gas Used by Second Supplier]

Next, a gas used by the second supplier 8 will be described. The gas 42 supplied from the second supplier 8 to the optical path space S flows near the optical element 3a. Hence, the gas 42 is preferably a clean gas that does not fog the optical element 3a. The clean gas means a gas containing less impurities such as acids, bases, and organic substances than the atmosphere in at least a portion where the outgas 50 has been generated. More preferably, a gas (to be called clean air) obtained by removing impurities such as acids, bases, and organic substances from air, a gas (to be called clean dry air) obtained by drying the clean air, an inert gas such as nitrogen gas, or the like may be used.

In some cases, the surrounding gas 41 to be drawn from the second opening 20b of the guide member 20 may be a gas contaminated with the outgas 50. However, if the gas 41 is away from the generation source of the outgas 50, it can be treated as a gas cleaner than the outgas 50. Preferably, the surrounding gas 41 in the space where the substrate stage 4 is arranged is straightened along a direction (−Y direction) from the second opening 20b to the first opening 20a of the guide member 20. In this case, the surrounding gas 41 to be drawn from the second opening 20b is maintained in a cleaner state than the atmosphere in the portion where the outgas 50 has been generated. In this embodiment, by blowing out the gas 41 from the first supplier 7, a gas flow along the direction (−Y direction) from the second opening 20b to the first opening 20a of the guide member 20 is formed inside the chamber 6. Therefore, the gas to be drawn into the guide member 20 from the second opening 20b is a gas cleaner than the atmosphere in the portion where the outgas 50 has been generated.

[Effect of Second Supplier]

Next, the effect of the second supplier 8 will be described. In order to prevent fogging of the optical element 3a, it is preferable to supply the gas 42 to the optical path space S, where light (pattern light) from the projection optical system 3 passes through, to blow off, from the optical path space S, the outgas 50 generated from the substrate W (resist). In order to efficiently blow off the outgas 50 from the optical path space S as described above, in general, it is desired to widely supply a gas to the optical path space S at a high flow velocity. However, in a conventional gas supply mechanism provided with only the gas blower 10, a gas is locally supplied at a high flow velocity in a portion where the gas is blown out from the blowing port 11 of the gas blower 10. In this case, the gas entrains the surrounding gas near the blowing port 11, and also entrains the outgas 50. Accordingly, when the gas blown out from the blowing port 11 reaches the optical path space S, this can be the gas contaminated with the outgas 50. Further, a flow of the outgas 50 toward the optical element 3a can be generated in the optical path space S by the gas entrained in the blowing port 11. Accordingly, it can be difficult to effectively blow off the outgas from the optical path space S. Increasing the flow amount or the range of the gas blown out from the gas blower 10 leads to consuming the gas in a larger amount. This can be disadvantage in the production cost of a semiconductor device or the like.

On the other hand, in the second supplier 8 according to this embodiment, the guide member 20 is provided in addition to the gas blower 10. This limits the portion where entrainment occurs due to the gas blower 10 to the second opening 20b, so that entrainment of the outgas 50 is reduced. That is, the cleanliness of the gas 42 is improved. In addition, the gas 43 blown out from the blowing port 11 of the gas blower 10 is mixed with the gas 41 drawn from the second opening 20b of the guide member 20 and supplied as the gas 42 from the first opening 20a to the optical path space S. That is, the gas 42 of a flow amount larger than the flow amount of the gas 43 blown out from the blowing port 11 can be supplied to the optical path space S. Further, since the flow velocity distribution of the gas blown out from the first opening 20a of the guide member 20 is more uniformized than the flow velocity distribution of the gas near the blowing port 11, the local high-flow-velocity distribution of the gas in the optical path space S can be mitigated. That is, it is possible to reduce the local flow velocity distribution in the optical path space S, reduce entrainment of the outgas 50, and widely supply the gas having a high flow velocity to the optical path space S. In this manner, as compared with a conventional gas supply mechanism, the second supplier 8 according to this embodiment can increase the effect of preventing fogging of the optical element 3a. Further, the second supplier 8 according to this embodiment can decrease the gas consumption. Therefore, it can be advantageous in the production cost of a semiconductor device or the like.

Second Embodiment

The second embodiment according to the present invention will be described. In this embodiment, a modification of the second supplier 8 will be described. Note that this embodiment basically takes over the first embodiment, and the arrangement and processing of an exposure apparatus 100 are similar to those in the first embodiment unless otherwise specified below.

Figure 8:
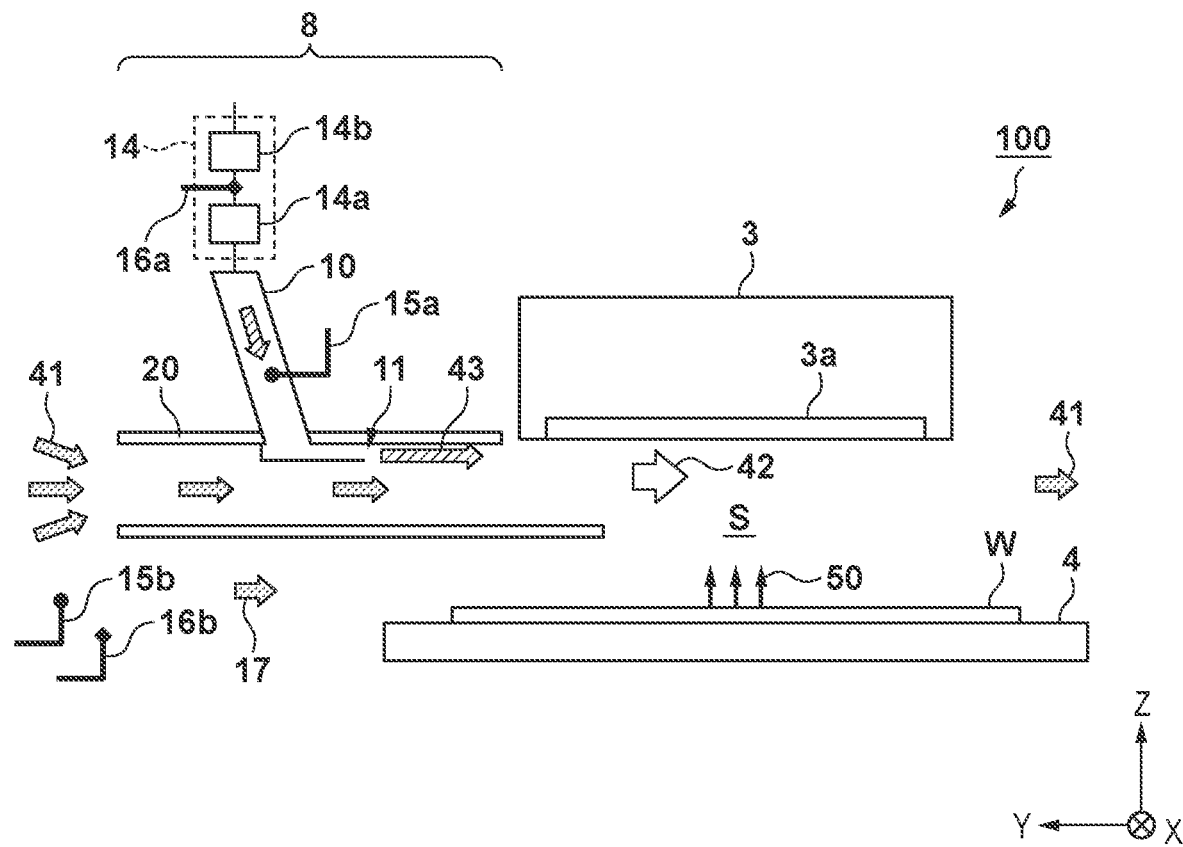
FIG. 8 is a view showing an arrangement example of a second supplier according to the second embodiment.

FIG. 8 is a view showing an arrangement example of a second supplier 8 according to this embodiment. In addition to the second supplier 8, FIG. 8 shows a part of a projection optical system 3 around the second supplier 8, a substrate W, and a substrate stage 4. Note that a gas exhauster 9 as shown in each of FIGS. 2A and 2B may also be provided in the arrangement shown in FIG. 8.

When the temperature and/or humidity of a gas 43 blown out from a blowing port of a gas blower 10 is different from the temperature and/or humidity of a gas 41 blown out from a first supplier 7, fluctuations may occur in the gas around an optical element 3a. Such fluctuations in the gas influence exposure light (pattern light) for exposing the substrate W and measurement light for measuring the position of the substrate stage 4, and this can make it difficult to accurately form a pattern on the substrate. To prevent this, the second supplier 8 according to this embodiment includes an air conditioner 14 that regulates the temperature and/or humidity of the gas 43 to be blown out from the blowing port 11 of the gas blower 10. The air conditioner 14 is provided on the upstream side of the air blower 10 (blowing port 11). The air conditioner 14 regulates the temperature and/or humidity of the gas supplied from a second gas supply source 32, and sends the regulated gas to the gas blower 10 (blowing port 11).

As an example, as shown in FIG. 8, the air conditioner 14 can include a temperature regulator 14a that regulates the temperature of the gas 43 to be blown out from the blowing port 11 and/or a humidity regulator 14b that regulates the humidity of the gas 43. The temperature regulator 14a uses a thermometer 15a that measures the temperature of the gas having undergone the temperature regulation and a thermometer 15b that measures the temperature inside a chamber 6 (the temperature of the gas 41 supplied from the first supplier 7) to regulate the temperature of the gas 43 to be blown out from the blowing port 11. For example, the temperature regulator 14a can regulate the temperature of the gas 43 to be blown out from the blowing port 11 such that the difference between the measurement result of the thermometer 15a and the measurement result of the thermometer 15b falls within an allowable range. On the other hand, the humidity regulator 14b uses a hygrometer 16a that measures the humidity of the gas having undergone the humidity regulation and a hygrometer 16b that measures the humidity inside the chamber 6 (the humidity of the gas 41 supplied from the first supplier 7) to regulate the humidity of the gas 43 to be blown out from the blowing port 11. For example, the humidity regulator 14b can regulate the humidity of the gas 43 to be blown out from the blowing port 11 such that the difference between the measurement result of the hygrometer 16a and the measurement result of the hygrometer 16b falls within an allowable range.

As has been described above, the second supplier 8 according to this embodiment includes the air conditioner 14 (temperature regulator 14a and humidity regulator 14b) that regulates the temperature and/or humidity of the gas 43 to be blown out from the blowing port 11 of the gas blower 10. With this arrangement, gas fluctuations around the optical element 3a can be reduced, and the pattern formation accuracy on the substrate can be improved.

Third Embodiment

The third embodiment according to the present invention will be described. In this embodiment, another modification of the second supplier 8 will be described. Note that this embodiment basically takes over the first embodiment, and the arrangement and processing of an exposure apparatus 100 are similar to those in the first embodiment unless otherwise specified below. Further, this embodiment can also take over the arrangement of the second embodiment.

Figure 9:
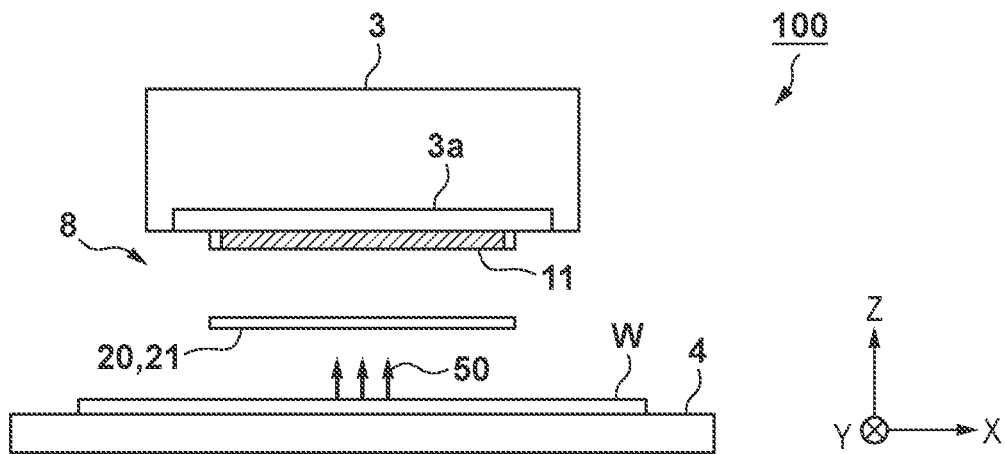
FIG. 9 is a view showing an arrangement example of a second supplier according to the third embodiment.

In the second supplier 8 according to the first embodiment, the guide member 20 is formed in a tubular shape. However, the present invention is not limited to this. For example, since the guide member 20 is arranged to control entrainment of the surrounding gas 41 into the gas 43 blown out from the blowing port 11 of the gas blower 10, the guide member 20 may be formed in a curved shape (arcuate shape) as long as it surrounds the blowing port 11. Alternatively, when giving attention to preventing entrainment of the outgas 50 into the gas 43 blown out from the blowing port 11, the guide member 20 is not limited to the tubular shape, but it may be formed without left and right side walls as shown in FIG. 9. FIG. 9 is a view of a second supplier 8 when viewed from the −Y direction side. A guide member 20 of the second supplier 8 shown in FIG. 9 includes only a first plate member 21 extended below a blowing port 11 so as to be arranged along the blowing direction (−Y direction) of a gas 43 from the blowing port 11. Note that in addition to the first plate member 21, the guide member 20 may further include a second plate member 22 extended above the blowing port 11. As compared with the arrangement including only the first plate member 21, the arrangement further including the second plate member 22 can improve the controllability of entrainment of a surrounding gas 41 into the gas 43 blown out from the blowing port 11.

Fourth Embodiment

The fourth embodiment according to the present invention will be described. In this embodiment, still another modification of the second supplier 8 will be described. Note that this embodiment basically takes over the first embodiment, and the arrangement and processing of an exposure apparatus 100 are similar to those in the first embodiment unless otherwise specified below. Further, this embodiment can also take over the arrangement of the second embodiment.

Figure 10:
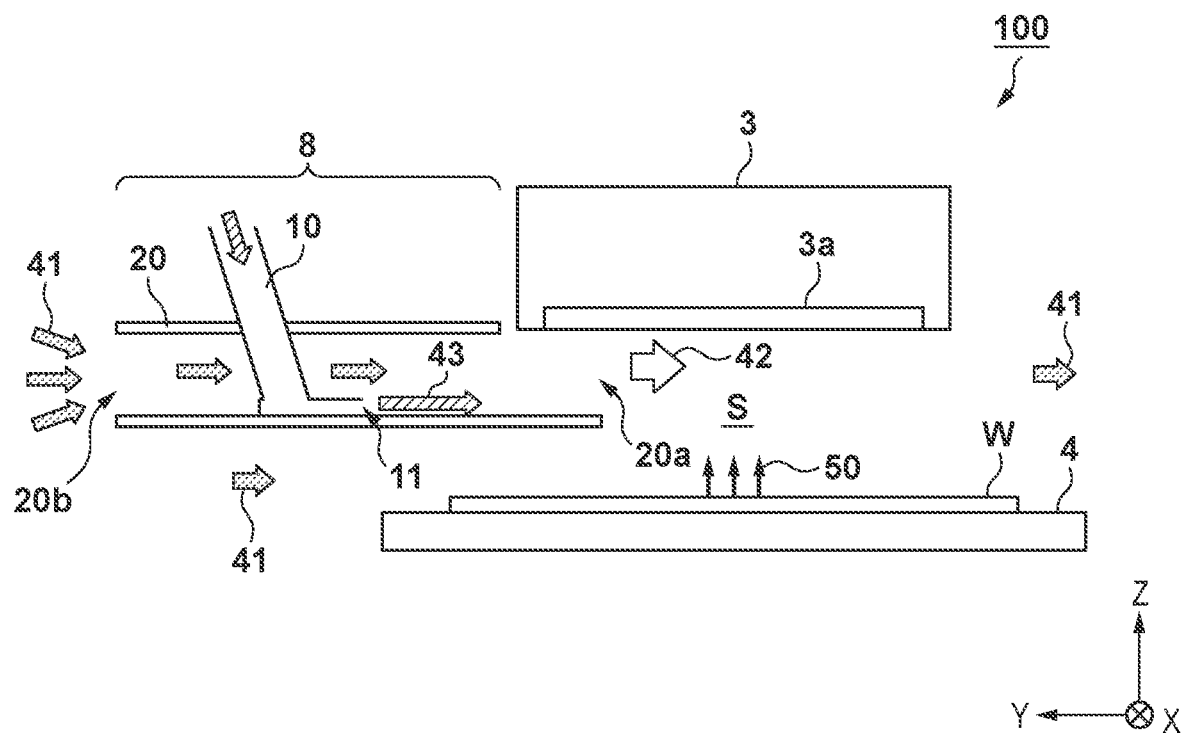
FIG. 10 is a view showing an arrangement example of a second supplier according to the fourth embodiment.

FIG. 10 is a view showing an arrangement example of a second supplier 8 according to this embodiment. In addition to the second supplier 8, FIG. 10 shows a part of a projection optical system 3 around the second supplier 8, a substrate W, and a substrate stage 4. Note that a gas exhauster 9 as shown in each of FIGS. 2A and 2B may also be provided in the arrangement shown in FIG. 10.

In the second supplier 8 according to this embodiment, a gas blower 10 (blowing port 11) is provided on the substrate side (that is, a first plate member 21) of a guide member 20 as shown in FIG. 10. In this case, in the flow velocity distribution of a gas 42 blown out from the second supplier 8, the flow velocity on the substrate side tends to be high. That is, it is possible to blow off an outgas 50 immediately after being generated from the substrate W, so that it is possible to effectively blow off the outgas 50 from an optical path space S to prevent the outgas 50 from reaching an optical element 3a. Further, in the second supplier 8 according to this embodiment, although the flow velocity on the optical element 3a side is lower than the flow velocity on the substrate side in the flow velocity distribution of the gas 42 blown out from the second supplier 8, but the flow velocity and flow amount sufficient for blowing off the outgas can be ensured. Accordingly, even if the outgas 50 passes on the optical element 3a side where the flow velocity of the gas is relatively low, it is possible to prevent the outgas 50 from reaching the optical element 3a.

Fifth Embodiment

The fifth embodiment according to the present invention will be described. In this embodiment, still another modification of the second supplier 8 will be described. Note that this embodiment basically takes over the first embodiment, and the arrangement and processing of an exposure apparatus 100 are similar to those in the first embodiment unless otherwise specified below. Further, this embodiment can also take over the arrangement of the second embodiment.

Figure 11:
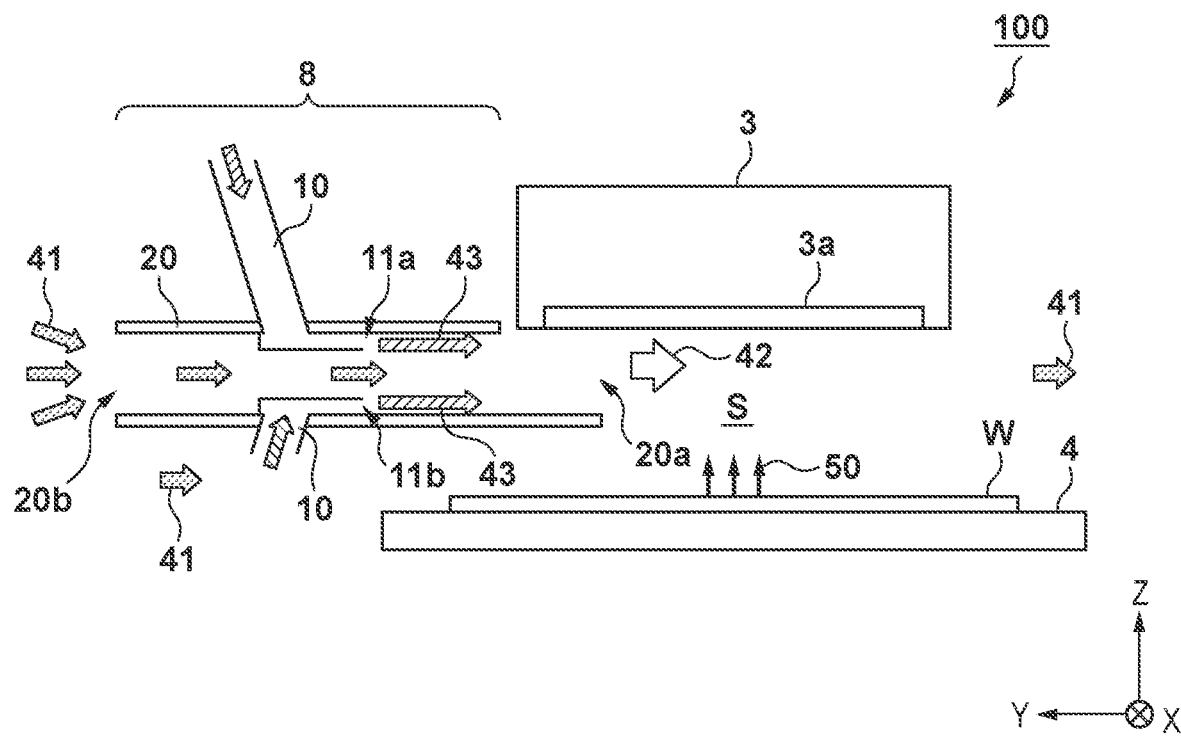
FIG. 11 is a view showing an arrangement example of a second supplier according to the fifth embodiment.

FIG. 11 is a view showing an arrangement example of a second supplier 8 according to this embodiment. In addition to the second supplier 8, FIG. 11 shows a part of a projection optical system 3 around the second supplier 8, a substrate W, and a substrate stage 4. Note that a gas exhauster 9 as shown in each of FIGS. 2A and 2B may also be provided in the arrangement shown in FIG. 11.

In the second supplier 8 according to this embodiment, a gas blower 10 includes a plurality of blowing ports 11. In the example shown in FIG. 11, the gas blower 10 includes a first blowing port 11a provided on an optical element 3a side (that is, a second plate member 22) of a guide member 20, and a second blowing port 11b provided on a substrate W side (that is, a first plate member 21) of the guide member 20. The supply source of the gas blown out from the first blowing port 11a and the supply source of the gas blown out from the second blowing port 11b may be included in a common system, or may be included in different systems. In the arrangement of the second supplier 8 according to this embodiment, in the flow velocity distribution of a gas 42 blown out from the second supplier 8, the flow velocity is high on both of the optical element 3a side and the substrate W side, so that the overall flow velocity tends to be uniformized. Therefore, it is possible to effectively blow off an outgas 50 from an optical path space S. In addition, since the overall flow velocity can be increased in the height direction, even in a case in which the outgas 50 is generated from the substrate W across a wide range and the outgas 50 leaks in the lateral direction (X-axis direction) of the second supplier 8, it is possible to effectively prevent the outgas 50 from reaching the optical element 3a. FIG. 11 shows an example in which a plurality of the gas blowers 10 extending through the first plate member 21 are provided, but a plurality of the gas blowers 10 extending through the second plate member 22 may be provided.

Sixth Embodiment

The sixth embodiment according to the present invention will be described. In this embodiment, still another modification of the second supplier 8 will be described. Note that this embodiment basically takes over the first embodiment, and the arrangement and processing of an exposure apparatus 100 are similar to those in the first embodiment unless otherwise specified below. Further, this embodiment can take over the arrangement of the second embodiment.

Figure 12:
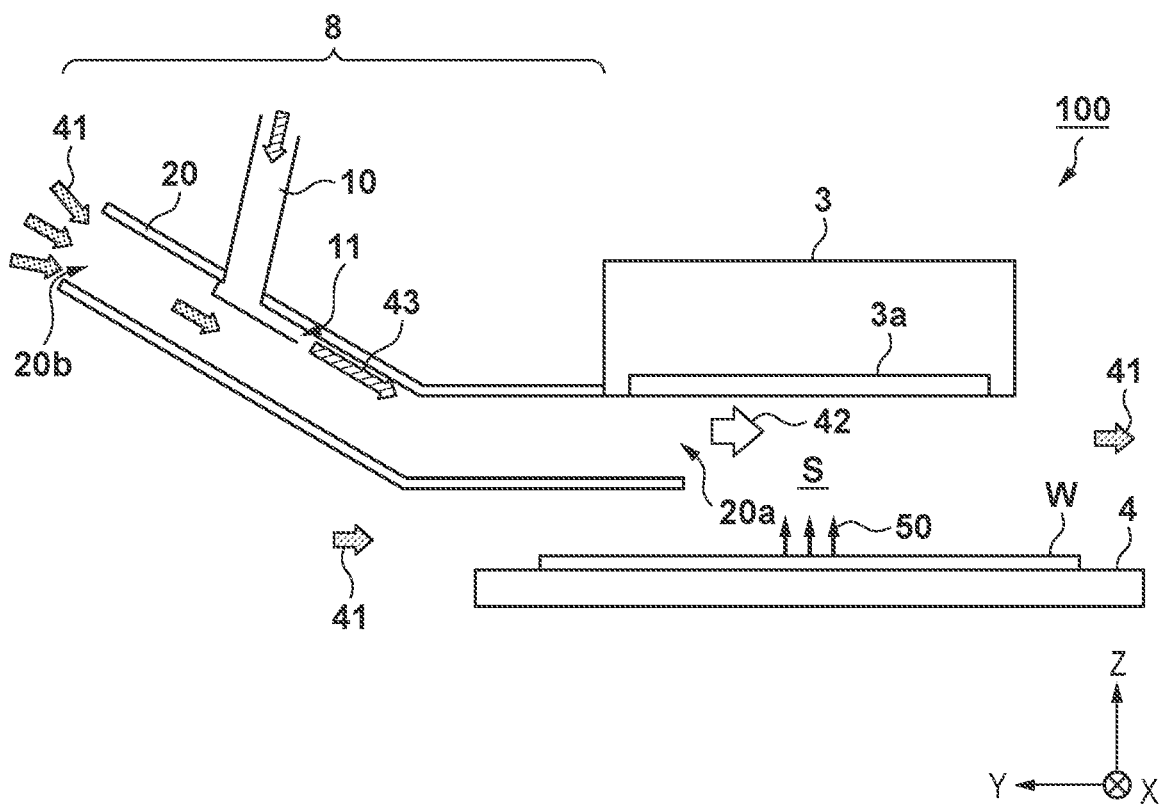
FIG. 12 is a view showing an arrangement example of a second supplier according to the sixth embodiment.

FIG. 12 is a view showing an arrangement example of a second supplier 8 according to this embodiment. In addition to the second supplier 8, FIG. 12 shows a part of a projection optical system 3 around the second supplier 8, a substrate W, and a substrate stage 4. Note that a gas exhauster 9 as shown in each of FIGS. 2A and 2B may also be provided in the arrangement shown in FIG. 12.

In the second supplier 8 according to this embodiment, a guide member 20 has a shape bending midway. At least one blowing port 11 can be arranged inside the guide member 20. In the arrangement shown in FIG. 12, the blowing port 11 is provided on an optical element 3a side (that is, a second plate member 22) of the guide member 20. However, the present invention is not limited to this, and the blowing port 11 may be provided on a substrate W side (that is, a first plate member 21) of the guide member 20, or blowing ports 11 may be provided on both the optical element 3a side and the substrate W side. The arrangement of the second supplier 8 according to this embodiment is advantageous in a case in which the second supplier 8 cannot be arranged due to spatial restriction around a projection optical system 3 (optical element 3a), or the like.

Seventh Embodiment

The seventh embodiment according to the present invention will be described. In this embodiment, an arrangement example of a second supplier 8 will be described. Note that this embodiment basically takes over the first embodiment, and the arrangement and processing of an exposure apparatus 100 are similar to those in the first embodiment unless otherwise specified below. Further, this embodiment can also take over the arrangement of each of the second to sixth embodiments described above.

In each of the above-described embodiments, an example has been described in which the second supplier 8 is arranged so as to supply the gas 42 to the optical path space S where light (pattern light) from the projection optical system 3 passes through. However, the present invention is not limited to this, and it is also possible to arrange the second supplier 8 so as to supply a gas 42 to an optical path space where light (slit-shaped light) from an illumination optical system 1 passes through. For example, the second supplier 8 may be arranged so as to supply the gas 42 to a space between the illumination optical system 1 and an original M (original stage 2) where light from the illumination optical system 1 passes through. Alternatively, the second supplier 8 may be arranged so as to supply the gas 42 to a space between the original M (original stage 2) and a projection optical system 3 where light transmitted through the original M passes through. With this arrangement, it is possible to prevent an outgas from reaching an optical element of the illumination optical system 1 or the original M and fogging the optical element or the original M.

Here, factors that cause fogging of an optical element of the illumination optical system 1 will be described. In general, not all the parts of the original stage 2 are made of a metal having undergone washing. For example, there are a resin part, an adhesive agent, and a grease, and even a metal part includes an insufficiently washed area. In this case, an outgas can be generated from the resin part, the adhesive agent, the grease, and the insufficiently washed area. If the outgas reaches an optical element of the illumination optical system 1, it causes fogging of the optical element. Similarly, if the outgas generated from the part of the original stage 2 reaches the original M, it causes fogging of the original M. Further, there is a case in which the illumination optical system 1 and/or the projection optical system 3 uses, like the original stage 2, a part from which an outgas is generated. Also in this case, if the outgas reaches an optical element of the illumination optical system 1 or the original M, it causes fogging of the optical element or the original M. In the cases as described above, by arranging the second supplier 8 described in each of the first to fourth embodiments so as to supply the gas 42 to an optical path space of light from the illumination optical system 1, it is possible to prevent the outgas from reaching the optical element of the illumination optical system 1 and/or the original M. That is, fogging of the optical element of the illumination optical system 1 and/or the original M can be reduced (suppressed).

Embodiment of Manufacturing Method of Article

A method of manufacturing an article according to the embodiment of the present invention is suitable for manufacturing an article, for example, a microdevice such as a semiconductor device or an element having a microstructure. The method of manufacturing an article according to the embodiment includes a step of forming a latent pattern to a photosensitive agent applied onto a substrate (a step of exposing a substrate) by using the above-described exposure apparatus, and a step of developing (processing) the substrate on which the latent pattern has been formed in the forming step. Furthermore, this manufacturing method includes other well-known steps (for example, oxidization, deposition, vapor deposition, doping, planarization, etching, resist removal, dicing, bonding, packaging, and the like). The method of manufacturing an article according to the embodiment is advantageous in at least one of the performance, quality, productivity, and production cost of the article, as compared with a conventional method.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-113191 filed on Jun. 30, 2020, which is hereby incorporated by reference herein in its entirety.

What is claimed is:

1. An exposure apparatus that exposes a substrate, comprising:
   an optical system configured to emit light for exposing the substrate;
   a guide member including a plate member configured to guide a gas to an optical path space where the light from the optical system passes through, and having a first opening and a second opening; and
   a blowing port arranged between the first opening and the second opening, and configured to blow out a first gas toward the first opening,
   wherein the plate member is fixed and arranged between the blowing port and the substrate arranged below the optical system, and
   wherein the guide member is configured to supply, from the first opening to the optical path space, a gas which includes the first gas blown out from the blowing port and a second gas drawn from the second opening and flowing between the blowing port and the plate member.

2. The apparatus according to claim 1, wherein
   the plate member includes a first end portion and a second end portion on an opposite side of the first end portion, and
   the first end portion is closer to the optical path space than the blowing port, and the second end portion is farther from the optical path space than the blowing port.

3. The apparatus according to claim 2, wherein
   the first end portion of the plate member is arranged on a side of a first direction in which the light is emitted from the optical system, with respect to the optical system.

4. The apparatus according to claim 2, wherein
   the optical system includes an optical element configured to transmit or reflect light, and
   the first end portion of the plate member is arranged on a side of a first direction in which the light is emitted from the optical system, with respect to a part of the optical element.

5. The apparatus according to claim 1, wherein
   the blowing port is arranged to be spaced apart from the plate member of the guide member.

6. The apparatus according to claim 1, wherein
   the guide member includes a second plate member arranged on an opposite side of the plate member with respect to the blowing port so as to face the plate member, and
   the blowing port is provided in the second plate member.

7. The apparatus according to claim 1, wherein
   the blowing port is provided in the plate member of the guide member.

8. The apparatus according to claim 1, wherein
   the guide member is formed in a tubular shape whose inner surface is partially defined by the plate member, and
   an area of the blowing port is smaller than a sectional area of the guide member.

9. The apparatus according to claim 8, wherein
   the guide member formed in the tubular shape includes the first opening and the second opening which is arranged on an opposite side of the first opening; and the first opening is closer to the optical path space than the blowing port, and the second opening is farther from the optical path space than the blowing port.

10. The apparatus according to claim 1, further comprising
a gas blower that includes a first tube portion including the blowing port as one end and arranged inside the guide member, and a second tube portion extending through the guide member and communicating to the other end of the first tube portion.

11. The apparatus according to claim 10, wherein
the gas blower includes a plurality of blowing ports.

12. The apparatus according to claim 1, further comprising a gas exhauster configured to exhaust a gas in the optical path space.

13. The apparatus according to claim 1, wherein
the optical system is a projection optical system that projects a pattern image to the substrate, and
the optical path space is a space between the projection optical system and the substrate where light from the projection optical system passes through.

14. The apparatus according to claim 13, further comprising a substrate stage configured to hold the substrate,
wherein the first opening is arranged between the projection optical system and the substrate stage.

15. The apparatus according to claim 1, wherein
the optical system is an illumination optical system that illuminates an original, and
the optical path space is at least one of a space between the illumination optical system and the original where light from the illumination optical system passes through and a space where the light transmitted through the original passes through.

16. The apparatus according to claim 15, further comprising an original stage configured to hold an original used for exposing the substrate,
wherein the first opening is arranged between the illumination optical system and the original stage.

17. A method of manufacturing an article, the method comprising:
exposing a substrate using an exposure apparatus defined in claim 1; and
developing the substrate exposed in the exposing,
wherein the article is manufactured from the developed substrate.

18. The apparatus according to claim 1, wherein the second opening is arranged at a position farther from the optical path space than the first opening.

19. The apparatus according to claim 1, wherein the blowing port is arranged inside the guide member.

20. The apparatus according to claim 1, wherein a flow velocity of the first gas blown out from the blowing port is higher than a flow velocity of the second gas drawn from the second opening.

21. The apparatus according to claim 1, further comprising:
a first supplier configured to supply the second gas to be drawn from the second opening; and
a second supplier configured to supply the first gas to be blown out from the blowing port.

22. The apparatus according to claim 21, wherein
the first supplier supplies, into a chamber in which the optical system is arranged, a gas from a first gas supply source, and
the second supplier supplies, to the optical path space, a gas from a second gas supply source different from the first gas supply source.

23. The apparatus according to claim 21, wherein the second supplier includes a temperature regulator configured to regulate a temperature of the first gas to be blown out from the blowing port.

24. The apparatus according to claim 21, wherein the second supplier includes a humidity regulator configured to regulate a humidity of the first gas to be blown out from the blowing port.

25. The apparatus according to claim 1, wherein the plate member is arranged on a side of a first direction with respect to the blowing port and extended along a second direction, the first direction being a direction in which the light is emitted from the optical system, and the second direction being a direction in which the first gas is blown out from the blowing port.

26. The apparatus according to claim 1, wherein the plate member is arranged at a position spaced apart from the blowing port.

27. The apparatus according to claim 1, further comprising a stage configured to hold the substrate, wherein the stage is movable below the plate member.

28. The apparatus according to claim 1, wherein the guide member is configured to supply, from the first opening to the optical path space, a gas in which the fist gas and the second gas are mixed between the first opening and the second opening.

* * * * *